(12) United States Patent
Okura et al.

(10) Patent No.: US 8,975,619 B2
(45) Date of Patent: Mar. 10, 2015

(54) SILICATE-BASED PHOSPHOR

(75) Inventors: Hiroshi Okura, Kanagawa (JP); Takeo Wakimoto, Tokyo (JP); Koutoku Ohmi, Tottori (JP); Yoshinobu Miyamoto, Tottori (JP)

(73) Assignee: Merck Patent GmbH, Darmstadt (DE)

( * ) Notice: Subject to any disclaimer, the term of this patent is extended or adjusted under 35 U.S.C. 154(b) by 114 days.

(21) Appl. No.: 13/818,784

(22) PCT Filed: Jul. 28, 2011

(86) PCT No.: PCT/EP2011/003801
§ 371 (c)(1),
(2), (4) Date: Feb. 25, 2013

(87) PCT Pub. No.: WO2012/025185
PCT Pub. Date: Mar. 1, 2012

(65) Prior Publication Data
US 2013/0153882 A1    Jun. 20, 2013

(30) Foreign Application Priority Data
Aug. 26, 2010    (EP) .................................... 10008871

(51) Int. Cl.
*H01L 29/08*    (2006.01)
*C09K 11/08*    (2006.01)
*C09K 11/59*    (2006.01)
*C09K 11/77*    (2006.01)
*H01L 33/50*    (2010.01)
*H05B 33/14*    (2006.01)

(52) U.S. Cl.
CPC ............. *C09K 11/59* (2013.01); *C09K 11/7734* (2013.01); *H01L 33/502* (2013.01); *H05B 33/14* (2013.01); *H01L 33/504* (2013.01)
USPC ..................................... 257/40; 252/301.4 R

(58) Field of Classification Search
CPC ....................................................... C09K 11/59
See application file for complete search history.

(56) References Cited

U.S. PATENT DOCUMENTS

| 7,276,183 | B2 | 10/2007 | Tian |
| 7,311,858 | B2 | 12/2007 | Wang et al. |
| 7,713,442 | B2 | 5/2010 | Tian et al. |
| 8,242,525 | B2 | 8/2012 | Tian et al. |
| 2006/0028122 | A1 | 2/2006 | Wang et al. |
| 2006/0214175 | A1 | 9/2006 | Tian |

(Continued)

FOREIGN PATENT DOCUMENTS

| WO | 2006/022792 A2 | 3/2006 |
| WO | 2006/104860 A2 | 10/2006 |

(Continued)

OTHER PUBLICATIONS

International Search Report for PCT/EP2011/003801 (Sep. 9, 2011).

(Continued)

*Primary Examiner* — Lex Malsawma
(74) *Attorney, Agent, or Firm* — Millen, White, Zelano & Branigan, P.C.

(57) ABSTRACT

The invention relates to co-activated silicate based phosphors. The invention further relates to the method of preparing these phosphors and to the use of these phosphors in electronic and electrooptical devices, in particular in light emitting diodes (LEDs) and solar cells. The invention further relates to illumination units comprising said phosphors.

20 Claims, 6 Drawing Sheets

(56) References Cited

U.S. PATENT DOCUMENTS

| | | |
|---|---|---|
| 2007/0125982 A1 | 6/2007 | Tian et al. |
| 2008/0128679 A1* | 6/2008 | Tian et al. ................ 257/14 |
| 2009/0289271 A1 | 11/2009 | Tian et al. |

FOREIGN PATENT DOCUMENTS

| | | | |
|---|---|---|---|
| WO | 2007/064414 | A1 | 6/2007 |
| WO | 2008/042740 | A1 | 4/2008 |
| WO | 2008/047965 | A1 | 4/2008 |
| WO | 2009/143283 | A1 | 11/2009 |

OTHER PUBLICATIONS

S. Ye et al., "Energy Transfer Among $Ce^{3+}$, $Eu^{2+}$, and $Mn^{2+}$ in $CaSiO_3$", Journal of the Electrochemical Society, vol. 155, No. 6 (2008) pp. J143-J147.

* cited by examiner

SILICATE-BASED PHOSPHOR

FIELD OF THE INVENTION

The invention relates to co-activated silicate based phosphors and a method of preparing them. The invention further relates to the use of these phosphors in electronic and electrooptical devices, in particular in light emitting diodes (LEDs) and solar cells. The invention further relates to illumination units comprising said silicate-based phosphors and further relates to LCD backlighting systems.

BACKGROUND AND PRIOR ART

White light-emitting diodes (LEDs) are regarded as the next-generation light source because of their high efficiency, long lifetimes, weak environmental impact, absence of mercury, short response times, applicability in final products of various sizes, and many more favorable properties. White LEDs, which are gaining attention as backlight sources for liquid crystal displays of tools such as lighting, computer notebooks, and cell phones, are prepared by adding a yellow light (560 nm) emitting YAG:Ce phosphor to a blue LED. Because white LEDs prepared from blue LEDs are excited by light having a wavelength ranging from 450 to 470 nm, only a limited number of phosphors can be used. That is, only YAG:Ce-based white LEDs can be obtained using blue LEDs having a wavelength range of from 450 to 470 nm. Therefore, there is an urgent need for the development of phosphors other than YAG:Ce.

As UV LEDs are developed as an excitation light source, a new era has opened in making white LEDs with single chips. That is, by using red, green and blue phosphors with a chip having light with a wavelength ranging from 380 to 410 nm as an energy source, it has become possible to obtain a tri-color white LED with better luminescence strength and offering superior white color. Consequently, a phosphor that can be excited in the wavelength range of from 380 to 410 nm is required. In particular, a new phosphor emitting light in the range of red is needed to obtain white light with good efficiency and a high color rendering index (CRI).

WO 2006/104860 (Sarnoff Corp.) describes silicate-silica-based polymorphous phosphors according to the formula $[(BvSiO_3)_x(Mv_2SiO_3)_y(Tv_2(SiO_3)_3)_z]_m(SiO_2)_n$:Eu, Mn, X, wherein X is a halogenide. A drawback of these halogenide-containing phosphors is a lack of chemical stability.

WO 2008/047965 describes a luminescent material of the formula $(Ca,Sr,Ba)_\alpha Si_\beta O_\gamma$:Eu, Mn, M, N, wherein M is at least one cation selected from the group consisting of Ce, Pr, Sm, Gd, Tb, Dy, Ho, Er, Tm and Yb and N is at least one cation selected from the group consisting of Li, Na, K, Al, Ga, In and Y.

DETAILED DESCRIPTION OF THE INVENTION

The invention relates to a compound of the formula comprising at least one silicate phosphor of formula I

$$(A_x, B_y, M_{1-x-y})SiO_3(SiO_2)_n \qquad (I)$$

wherein
M is at least one cation selected from the group consisting of Ca, Sr, Ba, A and B are independent from each other at least one element selected from the group consisting of Sc3+, Y3+, La3+, Ce3+, Pr3+, Nd3+, Pm3+, Sm3+, Sm3+, Eu3+, Gd3+, Tb3+, Tb3+, Dy3+, Ho3+, Er3+, Tm3+, Yb3+, Lu3+, Bi3+, Pb2+, Mn2+, Yb2+, Sm2+, Eu2+, Dy2+, and Ho2+, $0<n\le10$, preferably $0.5<n\le7$,
$0<x\le0.3$ and $0<y\le0.3$, preferably $0.02<x\le0.2$ and $0.02<y\le0.2$.
Preferably M is Ca.
Preferably A and B are $Eu^{2+}$ and $Mn^{2+}$.

The main emission peak wavelength of the Ca-containing phosphors according to formula I is between 580 nm and 670 nm and the color coordinate is characterized by x=0.48-0.62 and y=0.32-0.45.

Preferably, the phosphor shape of the Ca-containing phosphors is plate structure, but column structure is also possible.

Methods of preparing a co-activated silicate phosphor can be grouped into two general categories: solid-state diffusion method (also called solid-phase or mixing and firing method) and wet-chemical method (also called solution synthesis). According to the present invention the wet-chemicals methods for preparing the phosphors are preferred because of increased crystal quality, increased phosphor purity and homogeneity. It is most preferred using a wet-chemical method via coprecipitation (also called as hydrogen-carbonate precipitation) method.

Thus, the invention further relates to the method of preparing a composition of formula I comprising
a) mixing a silicon-containing agent and a salt containing elements M, A and B at a predetermined molar ratio in a solvent,
b) adding a precipitation agent,
c) performing primary heat treatment on the mixture in a temperature range of 900 to 1300° C., preferably 950 to 1050° C., under oxidative atmosphere,
d) performing secondary heat treatment on the mixture in a temperature range of 900 to 1300° C., preferably 950 to 1050° C., under reductive atmosphere.

Preferably the silicon-containing agent is $SiO_2$. However, it is also possible using organic silicon-containing agents such as tetraethoxysilane or tetramethoxysilane.

Preferably the salt (used in step a) is a nitrate, a halogenide, a hydrosulfate or a carbonate, very preferably a nitrate or a halogenide.

As precipitation agent (used in step b) it is preferred using a sodium hydrogen carbonate, ammonium chloride or ammonium hydrogen carbonate.

It is also preferred using a micro-reaction system to make the phosphors according to the invention. Concretely, micro-reaction method is a good method to produce a phosphor precursor in a limited small area that is mixed with two or more solutions through a flow channel with an internal diameter of from 1 mm to 10 mm. It is possible to make highly effective mixtures and reaction rate enhancements with easy temperature control, yield improvement, shape regulation, and safety. Such a micro-reactor system can control the size of precursors and the homogeneity of activators distribution easily (in comparison with other techniques).

Another object of the present invention is an illumination unit having at least one light source whose emission maximum is in the range 250 nm to 530 nm, preferably between 350 nm and 460 nm, where all or some of this radiation is converted into longer-wavelength radiation by a compound (phosphor) according to formula I.

Preferably the light source of the illumination unit comprises a luminescent blue emitting indium aluminium gallium nitride semiconductor, in particular of the formula $In_iGa_jAl_kN$ where $0\le i$, $0\le j$, $0\le k$, and $i+j+k=1$ which in combination with corresponding conversion phosphors, preferably emits white or virtually white light.

Preferably the illumination unit further comprises at least one compound (silicate phosphor) according to formula I and optionally further phosphors. Preferably the silicate phosphors according to the invention are red-emitting phosphors. Preferably the other phosphors emit either green light such as Ce-doped Lutetium-containing garnet, Eu-doped sulfoselenides, thiogallates, $BaMgAl_{10}O_{17}$:Eu,Mn (BAM:Eu, Mn), $SrGa_2S_4$:Eu and/or Ce- and/or Eu-doped nitride containing phosphors or emit blue light such as BAM:Eu or $Sr_{10}(PO_4)_6Cl_2$:Eu or emit yellow light such as garnet phosphors (e.g. $(Y,Tb,Gd)_3Al_5O_{12}$:Ce), ortho-silicates phosphors e.g. $(Ca,Sr,Ba)_2SiO_4$:Eu or Sialon-phosphors e.g. α-SiAlON:Eu.

Preferably the phosphor layer (phosphor blend) might disposed directly on the surface of the chip, or might be distributed in a specific volume directly above and/or around the chip or might be disposed in a layer or volume in specific distance of the chip (remote phosphor).

Another object of the present invention is a backlighting system having at least one illumination unit according to the present invention.

The backlighting system according to the invention can be, for example, a "direct-lit" backlighting system or a "side-lit" backlighting system, which has an optical waveguide and an outcoupling structure.

The backlighting system has a white light source, which is usually located in a housing, which preferably has a reflector on the inside. The backlighting system may furthermore have at least one diffuser plate.

In order to produce and display coloured images, the liquid-crystal unit is provided with a coloured filter. The coloured filter contains pixels in a mosaic-like pattern which transmit either red, green or blue light. The coloured filter is preferably arranged between the first polariser and the liquid-crystal cell.

The present invention further relates to a liquid-crystal display fitted with one or more backlighting system having at least one white light source, which comprises at least one semiconductor diode, preferably blue-emitting, and at least one phosphor layer comprising a phosphor blend as defined above.

A liquid-crystal display usually has a liquid-crystal unit and a backlighting system. The liquid-crystal unit typically comprises a first polariser and a second polariser and a liquid-crystal cell which has two transparent layers, each of which carries a matrix of light-transparent electrodes. A liquid-crystal material is arranged between the two substrates. The liquid-crystal material comprises, for example, TN (twisted nematic) liquid crystals, STN (supertwisted nematic) liquid crystals, DSTN (double supertwisted nematic) liquid crystals, FSTN (foil supertwisted nematic) liquid crystals, VAN (vertically aligned) liquid crystals or OCB (optically compensated bend) liquid crystals. The liquid-crystal cell is surrounded in a sandwich-like manner by the two polarisers, where the second polariser can be seen by the observer.

Also very highly suitable for monitor applications is IPS (in-plane switching) technology. In contrast to the TN display, the electrodes in whose electric field the liquid-crystal molecules are switched are only located on one side of the liquid-crystal layer in the IPS cell. The resultant electric field is inhomogeneous and, to a first approximation, aligned parallel to the substrate surface. The molecules are correspondingly switched in the substrate plane (in plane), which results in a significantly lower viewing-angle dependence of the transmitted intensity compared with the TN display.

Another, less well-known technique for good optical properties over a broad viewing angle is FFS technology and a further development thereof, AFFS (advanced fringe field switching) technology. It has a similar functional principle to IPS technology.

A transmissive LC display is obtained by transmitting backlight as white LEDs. A reflective LC display is obtained by reflecting outside light. A transflective LC display that combines reflection and transmission has recently attracted attention. The backlight is used in the dark, and the outside light is used in the brightness. In particular, it is possible to use such new LC display for displays as disclosed in WO 2010/028728 (Merck), which contains the compounds of formula I according to the invention in the reflective LC part.

A further aspect of the present invention is an electronic or electrooptical device comprising one or more phosphor blends as described above and below.

A further aspect is the use of at least one compound as described above and below in an electronic or electrooptical device. Especially preferred devices are LEDs for backlighting applications.

A further aspect is the use of at least one compound of the formula I according to the invention as conversion phosphor for conversion of all or some of the blue or near-UV emission from a luminescent diode.

The electronic or electrooptical device can also be for example an organic field effect transistor (OFET), thin film transistor (TFT), organic solar cell (O-SC), organic laser diode (O-laser), organic integrated circuit (O-IC), radio frequency identification (RFID) tag, photodetector, sensor, logic circuit, memory element, capacitor, charge injection layer, Schottky diode, planarising layer, antistatic film, conducting substrate or pattern, photoconductor, electrophotographic element, or organic light emitting transistor (OLET).

Owing to the low spectral response for solar cells, light with a short wavelength is not effectively used to generate electric power. However, it is possible to improve silicon solar cells efficiency e.g. by using the conversion phosphors according to the invention.

Thus, a further aspect is the use of at least one compound of the formula I according to the invention as wavelength conversion material in solar cells, preferably amorphous silicon solar cells.

Definition of Terms

The term "silicon containing agent" means an anorganic silicon compound preferably an oxide of silicon e.g. with a chemical formula of $SiO_2$. It has a number of distinct crystalline forms (polymorphs) in addition to amorphous forms. Preferably the $SiO_2$ should be in small particles, more preferably with a diameter of less than 1 μm, and still more preferably of less than 200 nm. Furthermore, "silicon containing agent" means also organic silicon compounds such as tetra-alkyl ortho-silicates.

The term "phosphor blend" is a phosphor mixture, in which two or more phosphors are blended together to create a new material with different physical properties.

The term "blue-emitting phosphor" refers to a phosphor having wavelength with at least one emission maximum between 435 nm and 475 nm.

The term "green emitting phosphor" refers to a phosphor having wavelength with at least one emission maximum between 508 nm and 550 nm.

The term "yellow emitting phosphor" or "phosphor emits yellow light" refers to a phosphor having wavelength with at least one emission maximum between 551 nm and 585 nm.

The term "red-emitting phosphor" refers to a silicate phosphor having wavelength with at least one emission maximum between 600 and 670 nm.

The term "Solid state diffusion method" (mixing & firing method or solid-phase method) means mixing oxidic starting materials as powders, grinding the mixture and then calcining the ground powders in a furnace at temperatures up to 1500° C. for up to several days in an optionally reductive atmosphere (see e.g. Phosphor Handbook, second edition, CRC Press, 2007, 341-354)

The term "wet-chemical methods" according to the invention encompasses at least three process variants:

In the first very preferred process variant, so-called hydrogencarbonate precipitation, firstly alkaline earth metal starting materials, preferably alkaline earth metal halides or nitrate, are dissolved in water with a europium- and mangan-containing dopant, and subsequently an inorganic or organic silicon-containing compound is added. Precipitation is carried out using a hydrogencarbonate solution, causing the slow formation of the phosphor precursor.

In the second process variant, an organosilicon compound, preferably $Si(OEt)_4$, is added for example, hydroxide solutions of the corresponding phosphor starting materials and a Eu- and Mn-containing dopant at elevated temperatures, causing the formation of the phosphor precursor.

In the third process variant, so-called oxalate precipitation, firstly alkaline-earth metal halides are dissolved in water with a europium- and manganhalide and added to a silicon-containing mixture consisting of a dicarboxylic acid and an inorganic or organic silicon compound. Increasing the viscosity causes the formation of the phosphor precursor.

Finally thermal aftertreatment (calcination) of the phosphor precursor is necessary to obtain the finished silicate-based phosphor.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

The invention will now be described in more detail by reference to the following examples, which are illustrative only and do not limit the scope of the invention.

Example 1

Preparation of $CaSiO_3(SiO_2)$:Eu, Mn $Ca(NO_3)_2 \times 4H_2O$ (7.97 g, 0.0338 mol, Merck), $SiO_2$ (4.06 g, 0.0675 mol, Merck), $Eu(NO_3)_3 \times 6H_2O$ (1.12 g, 0.0025 mol, Auer-Remy), and $Mn(NO_3)_2 \times 4H_2O$ (0.63 g, 0.0025 mol, Merck) are dissolved in deionized water. $NH_4HCO_3$ (26.9 g, 0.34 g, Merck) are dissolved in deionized water. The two aqueous solutions are simultaneously stirred into deionized water. The resultant solution is evaporated to dryness at about 90° C., and the resultant solid is annealed at 1000° C. for 4 hours in the oxidation atmosphere. The resultant oxide materials are annealed at 1000° C. for 4 hours in the reduction atmosphere. After conventional purification steps using water and drying are performed, the desired $CaSiO_3(SiO_2)_1$:$Eu^{2+}$, $Mn^{2+}$ is formed. The composition ratio of the phosphor (Ca/Si ratio) is confirmed by WDX (=wavelength-dispersive X-ray spectrocopy). The phosphor emitted bright a red light peaking 610 nm upon 350 nm light excitation, as shown FIG. 1.

Example 2

Preparation of $CaSiO_3(SiO_2)_5$:Eu, Mn $Ca(NO_3)_2 \times 4H_2O$ (7.97 g, 0.0338 mol, Merck), $SiO_2$ (12.18 g, 0.2025 mol, Merck), $Eu(NO_3)_3 \times 6H_2O$ (1.12 g, 0.0025 mol, Auer-Remy), and $Mn(NO_3)_2 \times 4H_2O$ (0.63 g, 0.0025 mol, Merck) are dissolved in deionized water. $NH_4HCO_3$ (26.9 g, 0.34 g, Merck) are dissolved in deionized water. The two aqueous solutions are simultaneously stirred into deionized water. The resultant solution is evaporated to dryness at about 90° C., and the resultant solid is annealed at 1000° C. for 4 hours in the oxidation atmosphere. The resultant oxide materials are annealed at 1000° C. for 4 hours in the reduction atmosphere. After conventional purification steps using water and drying are performed, the desired $CaSiO_3 \cdot (SiO_2)_5$:$Eu^{2+}$, $Mn^{2+}$ is formed. The composition ratio of the phosphor (Ca/Si ratio) is confirmed by WDX (=wavelength-dispersive X-ray spectrocopy). The phosphor emitted bright a red light peaking 610 nm upon 350 nm light excitation, as shown FIG. 6.

Example 3

Preparation of $CaSiO_3(SiO_2)_{0.6}$:Eu, Mn

Calcium chloride dihydrate, $CaCl_2 \times 2H_2O$ (4.96 g, 0.0338 mol, Merck), silicon oxide, $SiO_2$ (2.03 g, 0.0338 mol, Merck), europium chloride hexahydrate, $EuCl_3 \times 6H_2O$ (0.92 g, 0.0025 mol, Auer-Remy), and manganese chloride tetrahydrate, $MnCl_2 \times 4H_2O$ (0.49 g, 0.0025 mol, Merck) were dissolved in deionized water. $NH_4HCO_3$ (26.9 g, 0.34 g, Merck) is dissolved in deionized water. The two aqueous solutions are simultaneously stirred into deionized water. The resultant solution is evaporated to dryness at about 90° C., and the resultant solid is annealed at 1000° C. for 4 hours in the oxidative atmosphere. The resultant oxide materials are annealed at 1000° C. for 4 hours in the reductive atmosphere. After the resultant materials are pounded in a mortar, the resultant materials are re-annealed. After conventional purification steps using water and drying are performed, the desired $CaSiO_3(SiO_2)_{0.6}$:$Eu^{2+}$, $Mn^{2+}$ is formed as evidenced by XRD pattern shown in FIG. 3. The composition ratio of the phosphor is confirmed by WDX. The phosphor emits bright red light peaking 610 nm upon 350 nm light excitation, as shown FIG. 2.

Example 4

Preparation of $CaSiO_3(SiO_2)_{0.6}$:$Eu^{2+}$, $Mn^{2+}$ using Micro-Reaction System The influence of the product has been investigated by changing the tube diameter and flow rate. Tube diameter influences activators distribution, and flow rate influences the crystalline. The manufacturing process of this $CaSiO_3 (SiO_2)_{0.6}$:$Eu^{2+}$, $Mn^{2+}$ phosphor using a micro-reactor is as follows. First, Calcium chloride dihydrate, $CaCl_2 \times 2H_2O$ (4.96 g, 0.0338 mol, Merck), silicon oxide, $SiO_2$ (2.03 g, 0.0338 mol, Merck), europium chloride hexahydrate, $EuCl_3 \times$ 6H$_2$O (0.92 g, 0.0025 mol, Auer-Remy), and manganese chloride tetrahydrate, MnCl$_2$×4H$_2$O (0.49 g, 0.0025 mol, Merck) are dissolved in deionized water. NH$_4$HCO$_3$ (26.9 g, 0.34 g, Merck) is dissolved in deionized water. The solutions are pumped at the same time and driven a reaction at the connector. The reaction solution is passed through the tube at about 60° C. Precursors are caught in a beaker. The resultant solution is evaporated to dryness at about 90° C., and the resultant solid is annealed at 1000° C. for 4 hours in the oxidation atmosphere. The resultant oxide materials are annealed at 1000° C. for 4 hours in the reduction atmosphere. After conventional purification steps using water and drying are performed, the desired CaSiO$_3$(SiO$_2$)$_{0.6}$:Eu$^{2+}$, Mn$^{2+}$ is formed. The composition ratio of the phosphor was confirmed by WDX. The phosphor emits bright red light peaking 610 nm upon 350 nm light excitation, as shown FIG. 4.

Example 5

Production and Characterization of an LED and Installation in a Liquid-crystal Display The phosphor from Example 1 is mixed with a silicone resin system OE 6550 from Dow Corning with the aid of a tumble mixer (final concentration of phosphor in silicone: 8%).

The mixture is introduced into a cartridge which is connected to the metering valve of a dispenser. Raw LED packages, consisting of bonded InGaN chips having a surface area of 1 mm$^2$ each, which emit at a wavelength of 450 nm, are fixed in the dispenser. The cavities of raw LED packages filled with the silicone phosphor by means of the xyz positioning of the dispenser valve. The LEDs treated in this way are then subjected to a temperature of 150° C., at which the silicone is solidified. The LEDs can then be put into operation and emit white light having a colour temperature of 6000 K.

Several of the LEDs produced above are then installed in a backlighting system of a liquid-crystal display.

A common LCD TV color filter has been used in order to simulate display environment and to calculate the colour gamut that is realized by this LED.

Example 6

Making a White LED with 380 Nm-emitting LED Chip and a First Phosphor Blend

The phosphor blend is made of a red emitting co-activated silicate phosphor CaSiO$_3$(SiO$_2$)$_1$: Eu$^{2+}$, Mn$^{2+}$ as made in the Example 3, a green-emitting phosphor, BaMgAl$_{10}$O$_{17}$:Eu$^{2+}$, Mn$^{2+}$ (BAM:Eu, Mn) and a blue-emitting phosphor BaMgAl$_{10}$O$_{17}$:Eu$^{2+}$ (BAM:Eu). The three phosphors are mixed with appropriate weight ratios and the phosphor blend is further mixed with epoxy resin to form a slurry. The slurry is applied to an InGaN-based LED chip that emits at 380 nm. The device generates light with white color whose color coordinates can be varied by changing the ratio of the three phosphors.

DESCRIPTION OF THE DRAWINGS

The invention will be explained in greater detail below with reference to illustrative embodiments.

Figure 1:
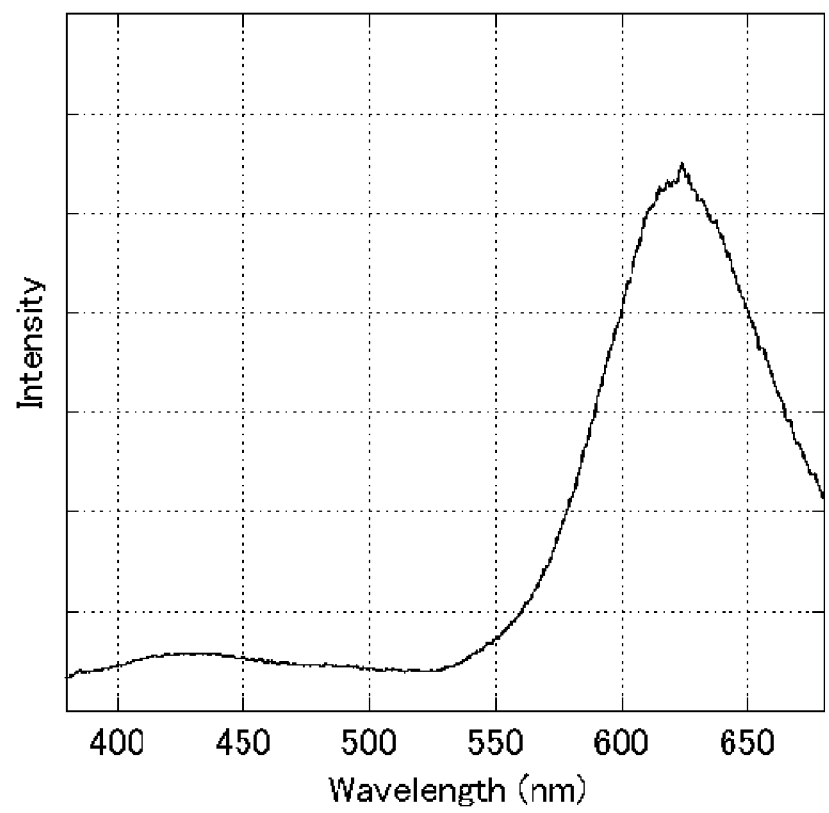
FIG. 1: shows an emission spectrum of CaSiO$_3$(SiO$_2$)$_1$:Eu, Mn. Its fluorescence band peaks are of about 610 nm.
Figure 2:
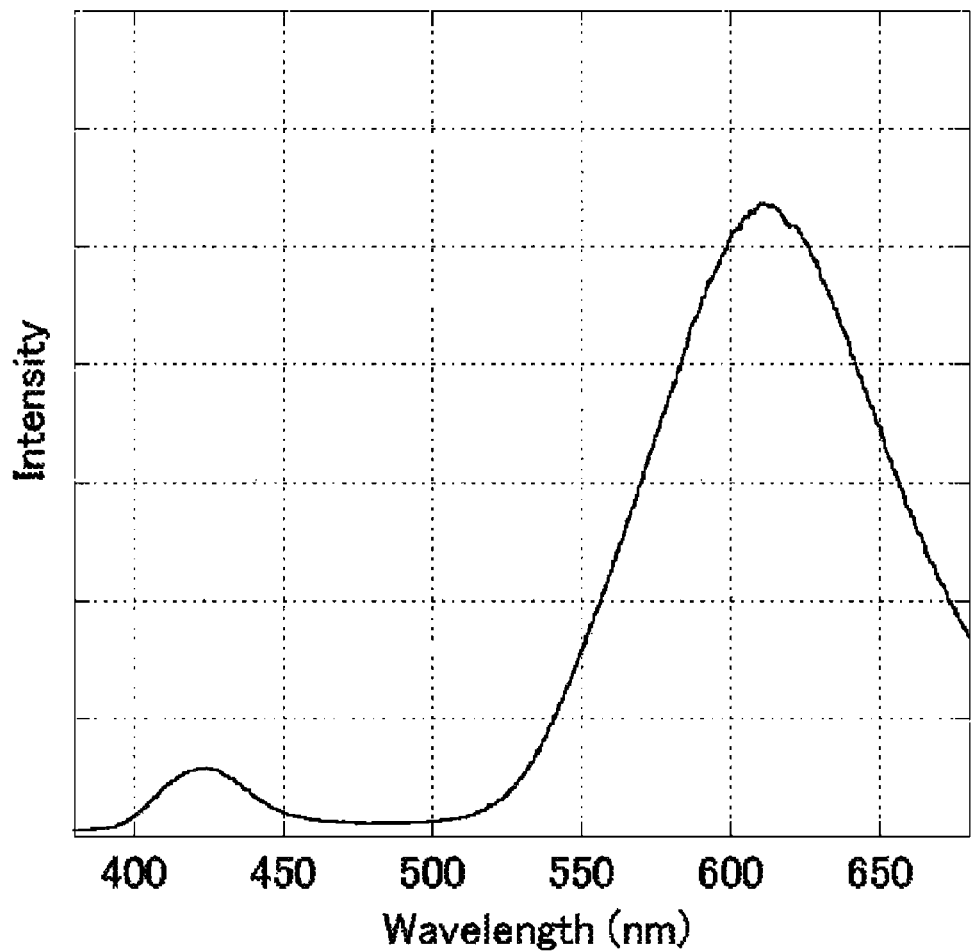
FIG. 2 shows an emission spectrum of CaSiO$_3$.(SiO$_2$)$_{0.6}$: Eu, Mn. Its fluorescence band peaks are of about 610 nm.
Figure 3:
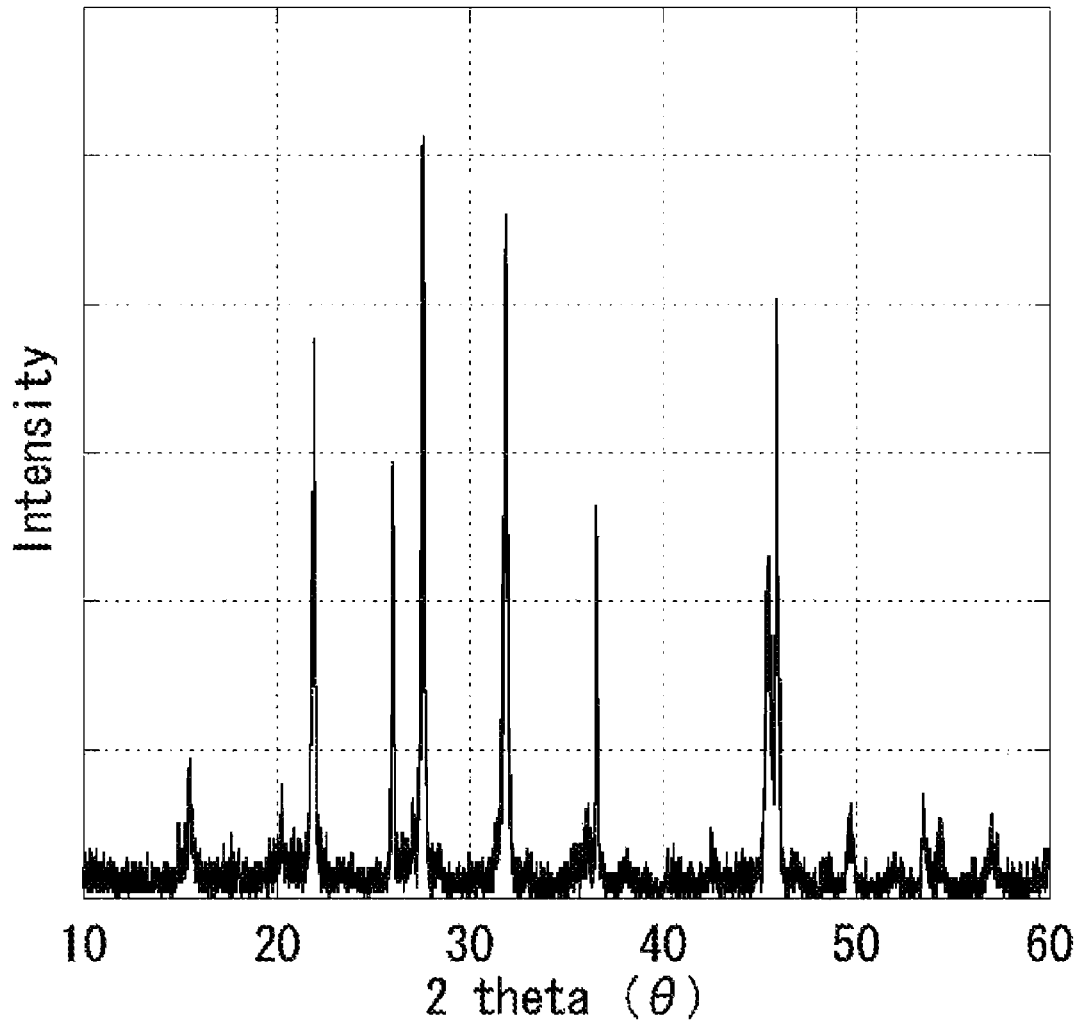
FIG. 3: shows a XRD pattern (measured by wavelength Cu$_{K\alpha}$) of CaSiO$_3$.(SiO$_2$)$_{0.6}$:Eu, Mn verifying the space group C2.
Figure 4:
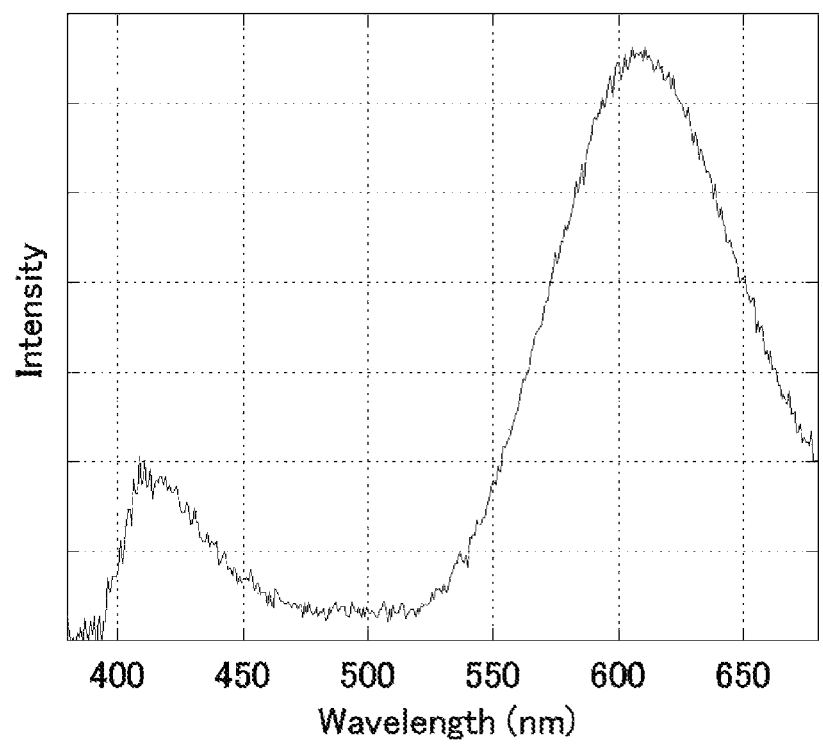
FIG. 4: shows an emission spectrum of CaSiO$_3$.(SiO$_2$)$_{0.6}$: Eu, Mn prepared by Micro-reaction system.
Figure 5:
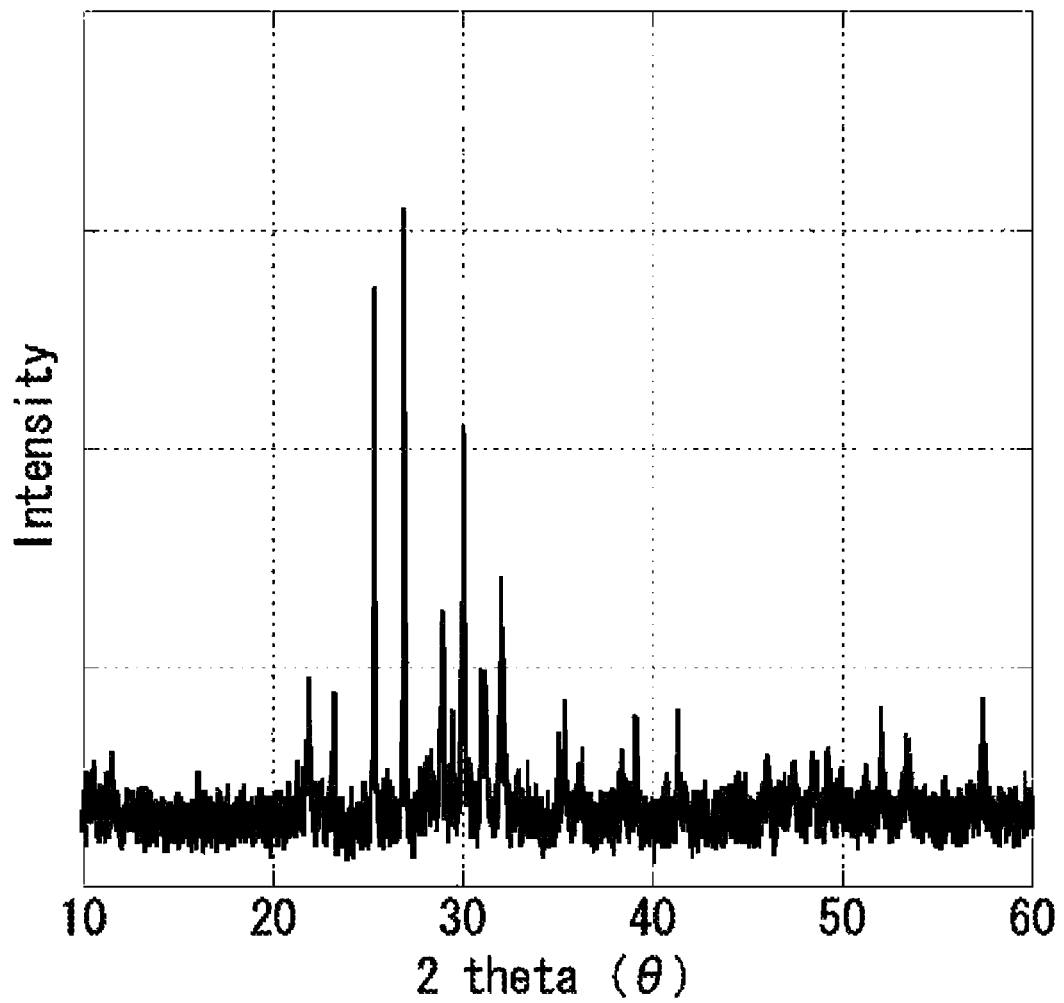
FIG. 5: shows a XRD pattern (measured by wavelength Cu$_{K\alpha}$) of CaSiO$_3$.(SiO$_2$)$_{0.6}$:Eu, Mn prepared by Micro-reaction system.
Figure 6:
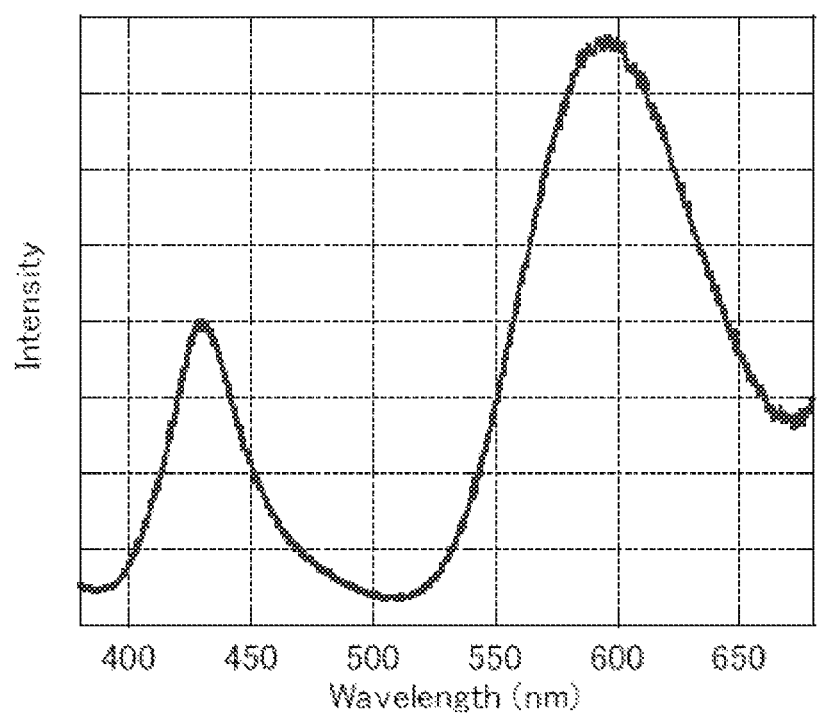
FIG. 6: shows the emission spectrum of CaSiO$_3$.(SiO$_2$)$_5$: Eu, Mn prepared by Micro-reaction system.

The invention claimed is:

1. A compound of formula I $$(A_x, B_y, M_{1-x-y})SiO_3.(SiO_2)_n \qquad (I)$$

wherein

M is at least one cation selected from the group consisting of Ca, Sr, and Ba,

A is at least one element selected from the group consisting of Sc3+, Y3+, La3+, Ce3+, Pr3+, Nd3+, Pm3+, Sm3+, Sm3+, Eu3+, Gd3+, Tb3+, Tb3+, Dy3+, Ho3+, Er3+, Tm3+, Yb3+, Lu3+, Bi3+, Pb2+, Mn2+, Yb2+, Sm2+, Eu2+, Dy2+, and Ho2+, B is at least one element selected from the group consisting of Sc3+, Y3+, La3+, Ce3+, Pr3+, Nd3+, Pm3+, Sm3+, Sm3+, Eu3+, Gd3+, Tb3+, Tb3+, Dy3+, Ho3+, Er3+, Tm3+, Yb3+, Lu3+, Bi3+, Pb2+, Mn2+, Yb2+, Sm2+, Eu2+, Dy2+, and Ho2+, 0<n≤10, 0<x≤0.3 and 0<y≤0.3.

2. The compound according to claim 1, wherein A and B are Eu$^2$+ and Mn$^{2+}$, respectively.

3. The compound according to claim 2, wherein M is Ca.

4. The compound according to claim 1, wherein 0.5<n≤7.

5. The compound to claim 1, wherein 0.02<x≤0.2 and 0.02<y≤0.2.

6. A method for preparing a compound of formula I according to claim 1 comprising a) mixing a silicon-containing agent and a salt containing elements M, A and B at a predetermined molar ratio in a solvent, b) adding a precipitation agent, c) performing primary heat treatment on the mixture in a temperature range of 900 to 1300° C. under oxidative atmosphere, and d) performing secondary heat treatment on the mixture in a temperature range of 900 to 1300° C. under reductive atmosphere.

7. The method according to claim 6, wherein the salt containing elements M, A and B is a nitrate, a halogenide, a hydrosulfate or a carbonate.

8. The method according to claim 6 wherein the precipitation agent is sodium hydrogen carbonate, ammonium chloride or ammonium hydrogen carbonate.

9. The method according to claim 6, wherein the silicon-containing agent is SiO$_2$.

10. An illumination unit having at least one light source whose emission maximum is in the range of 250 nm to 530 nm, where all or some of this radiation is converted into longer-wavelength radiation by a compound according to claim 1.

11. The illumination unit according to claim 10, wherein the light source is a luminescent indium aluminium gallium nitride.

12. A backlighting system having at least one illumination unit according to claim 10.

13. A liquid-crystal display fitted with one or more backlighting systems according to claim 12.

14. An electronic or electrooptical device comprising a compound according to claim 1.

15. A conversion phosphor for conversion of all or some of the blue or near-UV emission from a luminescent diode, comprising at least one compound of claim 1.

16. A wavelength conversion material for solar cells, comprising a compound of claim 1.

17. An illumination unit having at least one light source whose emission maximum is in the range of 350 nm to 460 nm, where all or some of this radiation is converted into longer-wavelength radiation by a compound according to claim 1.

18. The compound according to claim 1, wherein M is Ca.

19. A compound selected from the group consisting of
$CaSiO_3(SiO_2)$:Eu, Mn
$CaSiO_3(SiO_2)_5$:Eu, Mn
$CaSiO_3(SiO_2)_{0.6}$:Eu, Mn and
$CaSiO_3(SiO_2)_{0.6}$:Eu$^2+$, Mn$^2+$.

20. An illumination unit having at least one light source whose emission maximum is in the range of 250 nm to 530 nm, where all or some of this radiation is converted into longer-wavelength radiation by a compound according to claim 19.

* * * * *

UNITED STATES PATENT AND TRADEMARK OFFICE
CERTIFICATE OF CORRECTION

PATENT NO. : 8,975,619 B2
APPLICATION NO. : 13/818784
DATED : March 10, 2015
INVENTOR(S) : Hiroshi Okura et al.

It is certified that error appears in the above-identified patent and that said Letters Patent is hereby corrected as shown below:

In the Claims

Column 8, Line 35 reads: "5. The compound to claim 1, wherein $0.02 < x \leq 0.2$ and" should read
-- 5. The compound according to claim 1, wherein $0.02 < x \leq 0.2$ and --.

Signed and Sealed this
Twenty-first Day of July, 2015

Michelle K. Lee
*Director of the United States Patent and Trademark Office*